United States Patent
Farkas et al.

(10) Patent No.: US 7,493,542 B2
(45) Date of Patent: Feb. 17, 2009

(54) ARRANGEMENT FOR TESTING INTEGRATED CIRCUITS

(75) Inventors: Georg Farkas, Binz (CH); Steffen Gappisch, Zürich (CH)

(73) Assignee: NXP B.V., Eindhoven (NL)

(*) Notice: Subject to any disclaimer, the term of this patent is extended or adjusted under 35 U.S.C. 154(b) by 1552 days.

(21) Appl. No.: 09/932,086

(22) Filed: Aug. 17, 2001

(65) Prior Publication Data

US 2002/0047723 A1 Apr. 25, 2002

(30) Foreign Application Priority Data

Aug. 21, 2000 (DE) ................. 100 41 137

(51) Int. Cl.
*G01R 31/28* (2006.01)
*G06F 11/00* (2006.01)

(52) U.S. Cl. ............... 714/738; 714/30; 714/732; 714/733

(58) Field of Classification Search ............ 714/724, 714/732, 738, 30, 733
See application file for complete search history.

(56) References Cited

U.S. PATENT DOCUMENTS

| | | | | |
|---|---|---|---|---|
| 4,048,481 A | * | 9/1977 | Bailey et al. ............. | 714/41 |
| 4,070,565 A | * | 1/1978 | Borrelli .................... | 714/734 |
| 4,365,334 A | * | 12/1982 | Smith et al. ............... | 714/721 |
| 4,519,078 A | * | 5/1985 | Komonytsky .............. | 714/728 |
| 4,672,610 A | * | 6/1987 | Salick ....................... | 714/742 |
| 4,724,380 A | * | 2/1988 | Burrows et al. ............ | 714/732 |
| 4,872,168 A | * | 10/1989 | Aadsen et al. ............. | 714/720 |
| 5,010,552 A | * | 4/1991 | Dias et al. .................. | 714/742 |
| 5,535,165 A | * | 7/1996 | Davis et al. ................ | 365/201 |
| 5,812,562 A | * | 9/1998 | Baeg ........................ | 714/726 |
| 5,825,785 A | * | 10/1998 | Barry et al. ................ | 714/732 |
| 5,872,793 A | * | 2/1999 | Attaway et al. ............ | 714/726 |
| 5,946,247 A | * | 8/1999 | Osawa et al. .............. | 365/201 |
| 5,960,008 A | * | 9/1999 | Osawa et al. .............. | 714/726 |
| 6,154,862 A | * | 11/2000 | Tabata et al. .............. | 714/719 |
| 6,269,463 B1 | * | 7/2001 | Duggirala et al. .......... | 714/738 |
| 6,311,299 B1 | * | 10/2001 | Bunker ...................... | 714/719 |
| 6,430,720 B1 | * | 8/2002 | Frey et al. .................. | 714/744 |
| 6,442,722 B1 | * | 8/2002 | Nadeau-Dostie et al. ... | 714/731 |
| 6,477,672 B1 | * | 11/2002 | Satoh ........................ | 714/721 |
| 6,510,398 B1 | * | 1/2003 | Kundu et al. .............. | 702/117 |
| 6,631,486 B1 | * | 10/2003 | Komatsu et al. ........... | 714/724 |
| 6,665,817 B1 | * | 12/2003 | Rieken ...................... | 714/30 |

(Continued)

FOREIGN PATENT DOCUMENTS

GB 2218816 * 11/1989

(Continued)

OTHER PUBLICATIONS

Derwent Patent Abstract Acc No. 1988-141950, May 25, 1988, pp. 1-3.*

(Continued)

*Primary Examiner*—Guy J Lamarre
(74) *Attorney, Agent, or Firm*—Peter Zawilski

(57) ABSTRACT

The invention relates to an arrangement for testing integrated circuits, to a test system (2), to a circuit (1) to be tested, and to a method of testing logic circuits, where the test system (2) includes a programmable algorithmic test vector generator (4) which generates test vectors in real time so as to transfer these vectors to the circuit (1) to be tested.

11 Claims, 4 Drawing Sheets

U.S. PATENT DOCUMENTS 6,681,359 B1 * 1/2004 Au et al. .................. 714/733

OTHER PUBLICATIONS

Figure 1:
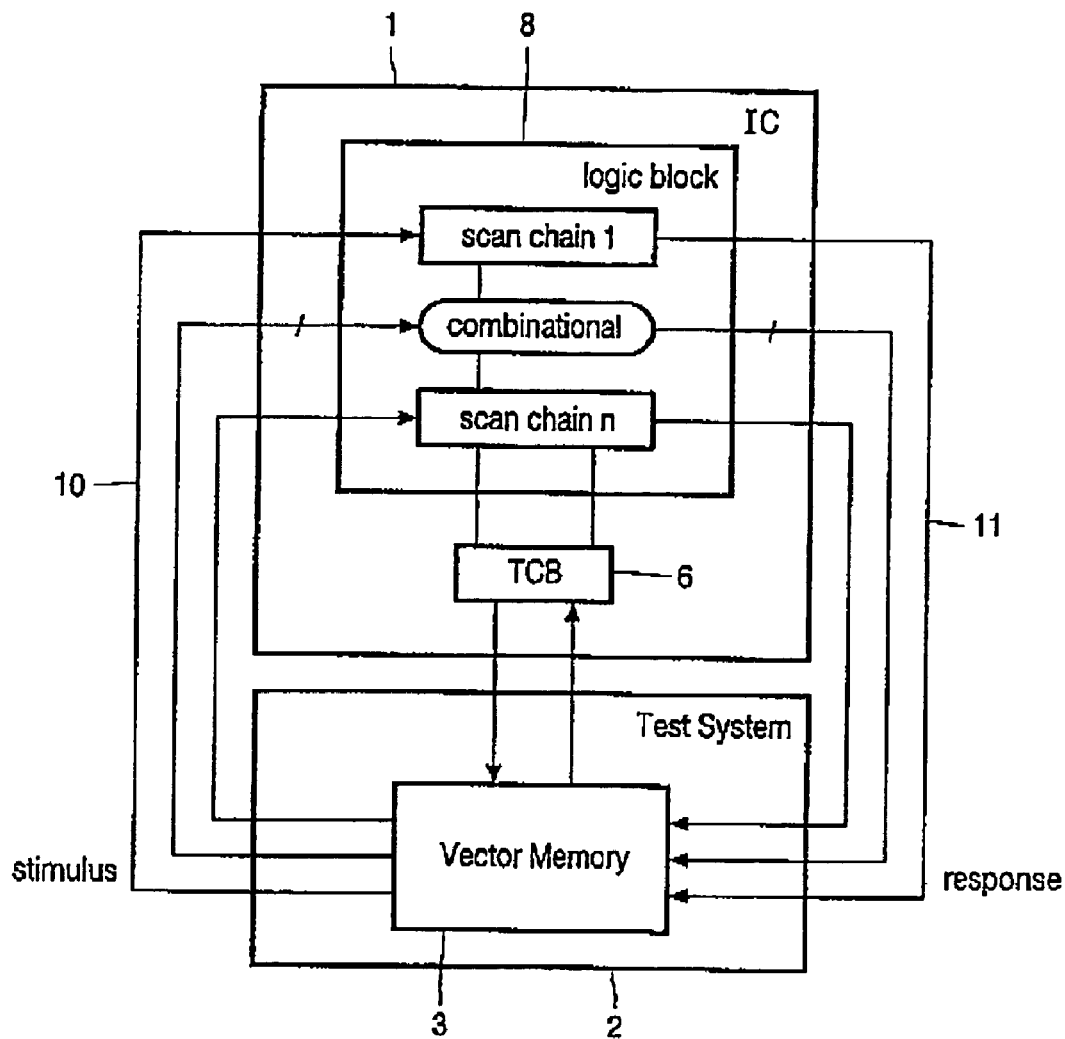

Hochbaum 'An optimal test compression procedure for combinational circuits Hochbaum,' IEEE Transactions onComputer-Aided Design of Integrated Circuits and Systems, vol. 15, Issue 10, Oct. 1996 pp. 1294-1299.*

NN74091034: "Circuit Diagnosis and Design Analysis System; IBM Tech. Discl. Bulletin, Jul. 1987, US, vol. 17 Issue: 4 pp. 1034-1035; Sep. 1, 1974".*

Abramovici et al. Digital Systems Testing and Testable Design, 1990, pp. 479-487.*

* cited by examiner

ARRANGEMENT FOR TESTING INTEGRATED CIRCUITS

The invention relates to an arrangement for testing integrated circuits, to a test system, to an integrated circuit to be tested, and to a method of testing logic circuits.

Test systems wherein test vectors that are required for a test are stored in a large test vector memory are known to be used for the testing of logic components or logic switching circuits. Test vectors represent a number of logic patterns. In addition to such a test device there is an alternative which consists of the integration of self-test units or BIST (Built In Self Test) units in the integrated circuits or ICs to be tested (Device Under Test or DUT). In the case of such BIST units the test vectors are generated in the DUT and the test response vectors are also processed in the DUT. The BIST units integrated in the DUT, however, take up an additional silicon surface area.

The test systems first mentioned may be provided either with very large test memories which, however, increase the complexity and also the costs of such test systems, or use may be made of test systems which generate appropriate test vectors by means of a simple Algorithmic Test Vector Generator (APG). Test systems for memory ICs generate the test vectors by means of such APGs. The generating of the memory test vectors is limited to simple test vectors which consist mainly of address values and data values.

Types of faults that [necessitate] require a significantly larger number of test vectors are liable to occur in sub-micron processes. Such a larger number of test vectors, however, necessitates an even larger and more expensive test vector memory.

Said other alternative for testing logic integrated circuits would be the integration of a BIST unit in such an IC. This method has the drawback that an additional silicon surface area is required and that an appropriate design is required for the testing of the special ICs. Such a BIST unit would generate test vectors on the chip. The test response after the logic is finished with the test vectors would be compressed into a signature by an analysis unit on the chip. The signature can then be derived from the output of the integrated circuit.

It is an object of the invention to provide a device for testing logic integrated circuits which requires only little additional surface area on the IC to be tested (DUT), that is, without degrading the test performance and without using large test memories.

The object of the invention is achieved in that an arrangement for the testing of integrated circuits is provided with a test system which includes a test vector generator for generating test vectors and a logic component provided on the IC to be tested.

In the test system there is implemented a test vector generator which is programmable and, therefore, is capable of generating test vectors which are transferred to the DUT. A programmable algorithm is implemented in the test vector generator. The test vectors traverse a logic component to be tested and are transferred to a test response analysis unit. The test response vectors traverse a sequential logic circuit in said test response analysis unit, are compressed and a check sum is formed. The check sum is transferred, by way of a test control block, to the test system in which the check sum is compared with a reference check sum.

The test vectors are generated in real time as in the BIST system, be it now in the test system. The large and expensive memory for the test vectors in the test system is replaced by the programmable algorithmic test vector generator which generates the test vectors. Such a test vector generator includes a processor, notably an arithmetic and logic unit (ALU), and its programming enables the required test vectors to be generated in real time.

This embodiment offers the advantage that testing can be performed at a high speed, because the test system enables fast driving of the DUT and because the amounts of data transferred from the DUT to the test system are small.

The test control block is responsible for the switching over between the various modes. For a test it is necessary to switch over the DUT from the normal mode to the test mode. The test control block controls the switching over of the circuit from a normal mode of operation to a test mode. The test control block then isolates the logic component from a periphery that is not required for a test and controls all control signals and data signals necessary for the transfer of the test vectors from the test system to the DUT and for the transfer of test responses and/or check sums from the DUT to the test system.

The test response analysis unit in a further embodiment of the invention is integrated in the test system together with the programmable algorithmic test vector generator. The programmable algorithmic test vector generator generates, via the processor, test vectors which are transferred to the DUT. The DUT transfers the test response vectors to the test response analysis unit which is included in the test system. The relevant test responses are compressed therein so as to form a check sum which is compared with a reference check sum in the test system.

This implementation has the drawback that integration of the test response analysis unit in the test system leads to a loss of speed. The DUT has to transfer all test response vectors to the test system and requires a corresponding amount of time for this purpose. However, an advantage is achieved in that logic circuits already in existence can be tested by means of such a test system without it being necessary to redesign such circuits.

When the test response analysis unit is implemented in the DUT, ultimately only the check sum will be transferred to the test system by way of the test control block. This has the drawback that fault localization is not possible, because it cannot be deduced why the check sum has been created in its present form. However, if the test response analysis unit is integrated in the test system, the test response vectors are applied directly to the test system after the test vectors have traversed the logic components in the DUT, thus enabling fault localization.

It is a further advantage of the invention that the programming of the test vector generator and its processor readily enables modification of the test vectors. This is not possible in known BIST test arrangements.

The most pronounced advantage of the invention is that the programmable test vector generator is capable of modifying simple test systems so that logic components can be tested by generating pseudo-random test vectors as well as deterministic test vectors.

In one embodiment of the invention as disclosed herein it is necessary to design the test response analysis unit so as to be included in the DUT.

For another embodiment of the invention as disclosed herein it is not necessary to design the DUT for the test, because the test response analysis unit is integrated in the test system.

External circumstances determine which of the above alternatives is used for the testing of logic components. In this respect it is to be taken into account how much time is available for the test, whether an additional design is possible for the test response analysis unit, etc.

Figure 2:
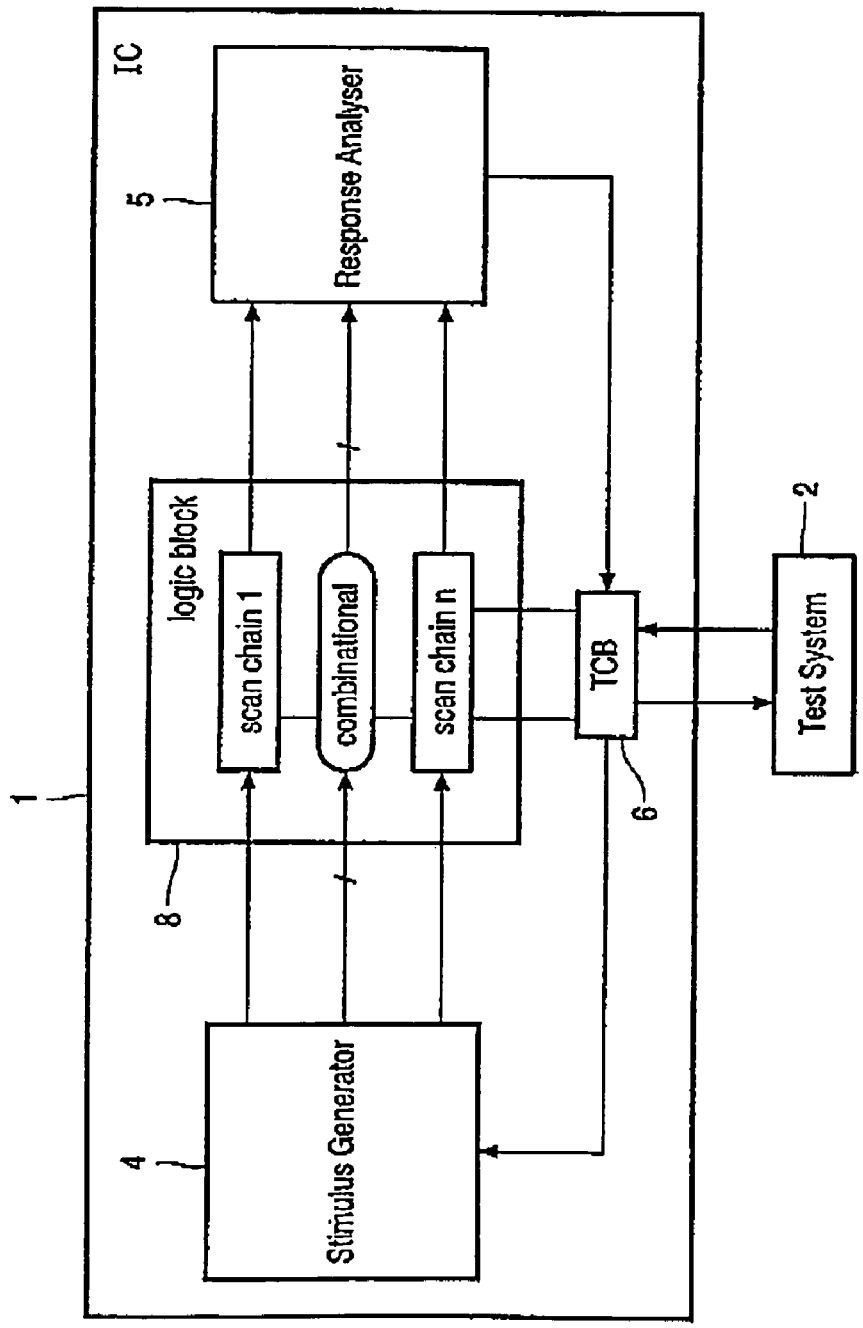
Figure 3:
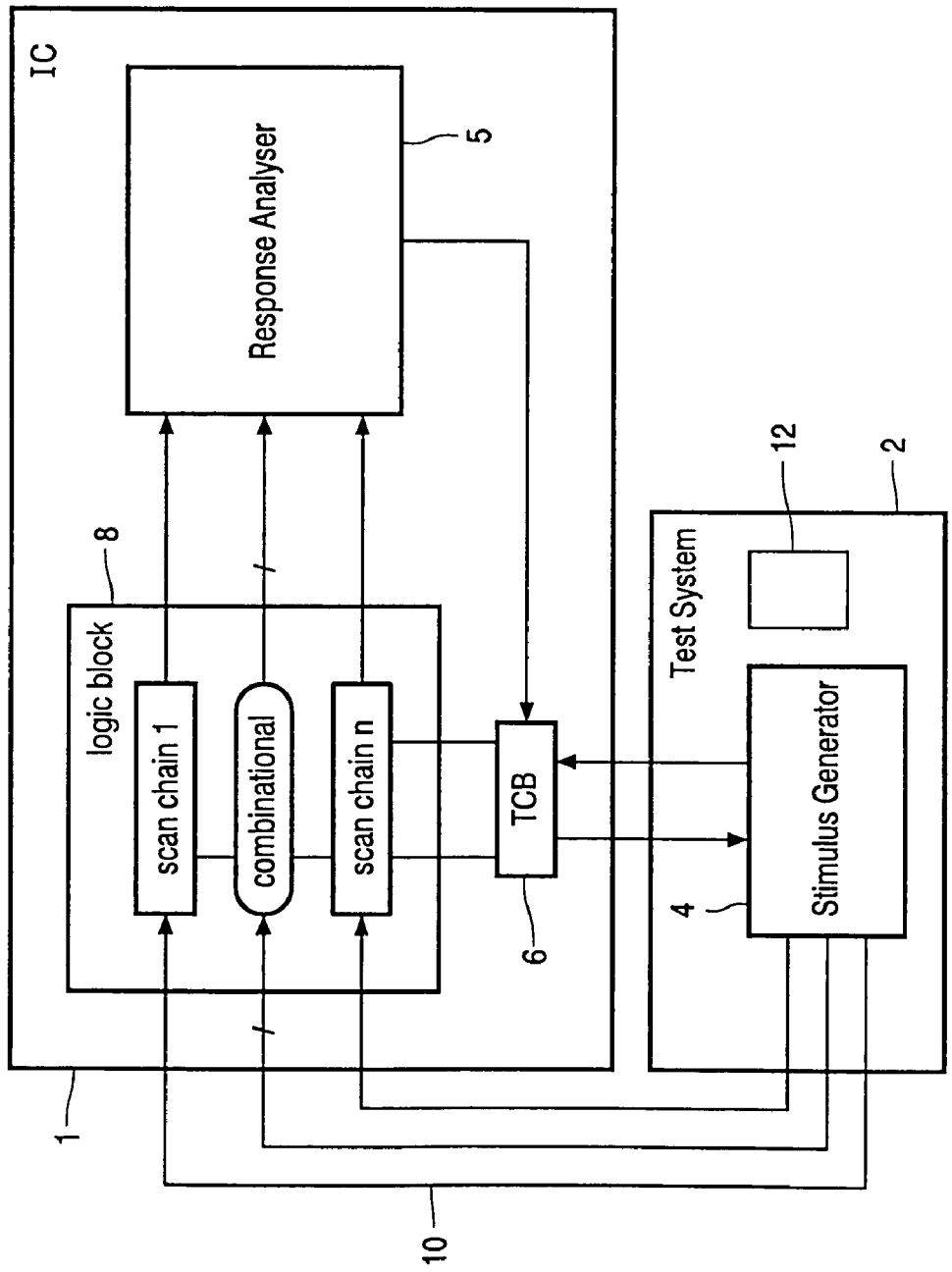
Figure 4:
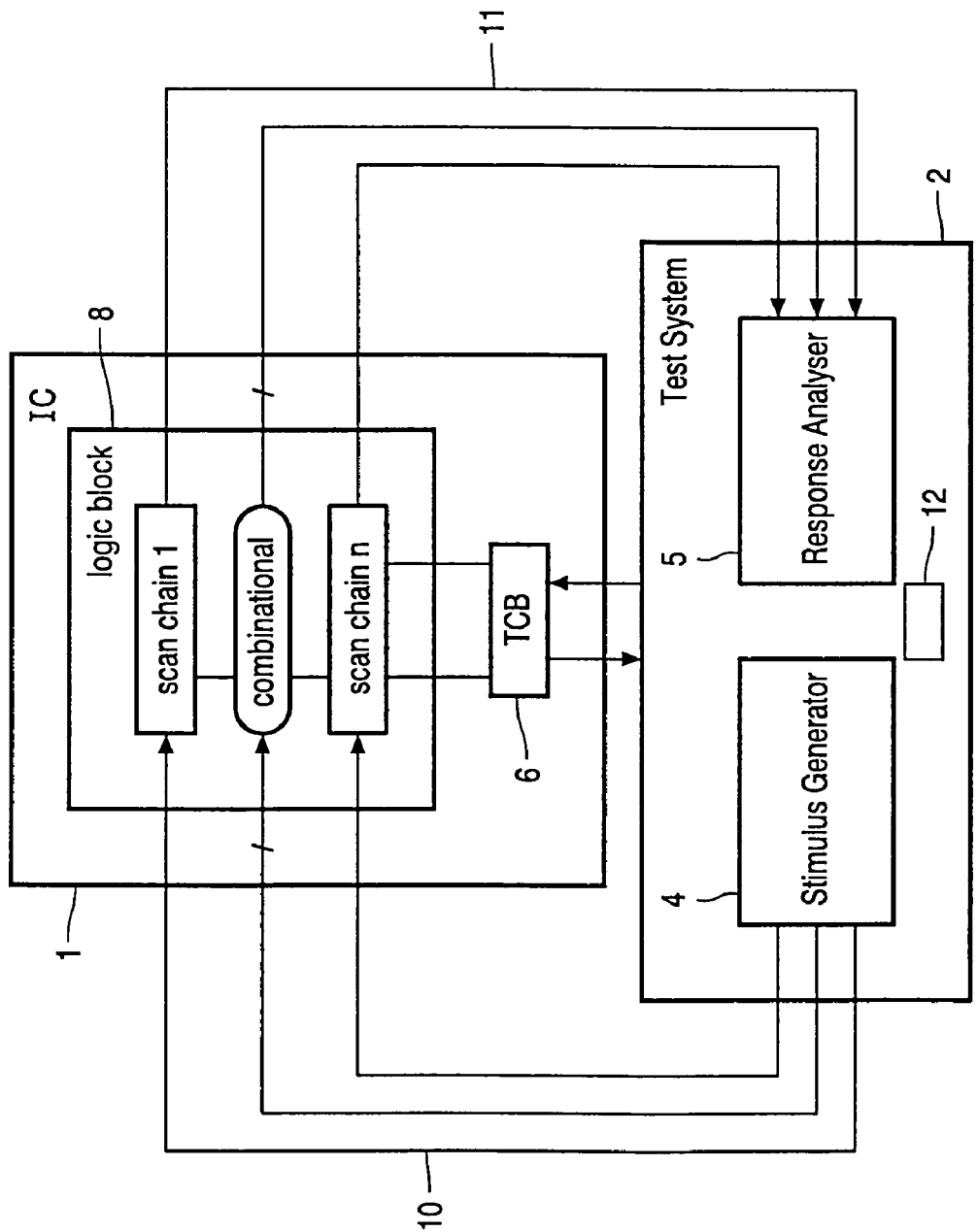

An embodiment will be described in detail hereinafter with reference to the drawing. Therein:

FIG. 1 shows a test system with a test vector memory in accordance with the present state of the art, FIG. 2 shows a BIST test arrangement in accordance with the present state of the art, FIG. 3 shows a DUT with a test response analysis unit and a test system with a test vector generator, and FIG. 4 shows a test system with a test vector generator and a test response analysis unit.

FIG. 1 shows the DUT 1 and the test system 2. The test system 2 includes the test vector memory 3. The test vector memory 3 may very easily reach the size of several megabytes. The DUT includes a logic component 8. The switching-over between the test mode and the normal mode of operation takes place via a test control block 6 which also controls the exchange of control data between the test system and the DUT. The test vectors are transferred via the connections 10 and the test response vectors are transferred via the connections 11.

FIG. 2 shows a known BIST unit which includes a test system. The programmable algorithmic test vector generator 4, the logic component 8, the test control block 6 and the test response analysis unit 5 are implemented in the DUT 1. The test system 2 initiates and controls the execution of the test and evaluates the check sum, produced by the DUT 1 and applied to the test system 2, by comparison of this check sum with a reference check sum in the test system.

FIG. 3 shows an implementation of such a test arrangement in accordance with the invention. The IC 1 (DUT) to be tested includes a logic component 8, a test control block 6 and a test response analysis unit 5. The test system 2 includes the programmable algorithmic test vector generator 4 which includes a processor 12. The test vector generator generates test vectors and applies these vectors, via the connection 10, to the DUT 1 in which the test vectors traverse the logic component 8. The test response vectors are applied to the test response analysis unit 5 in which they traverse a sequential logic circuit and a check sum is formed. Under the control of the test control block 6 the check sum is applied to a primary input/output of the test IC wherefrom the test system 2 can derive the check sum so as to compare it with a reference check sum, thus enabling a decision to be taken as regards a positive or a negative test result.

FIG. 4 shows a further embodiment of an arrangement in accordance with the invention for the testing of logic circuits. The DUT 1 includes a logic component 8 and the test control block 6. The programmable algorithmic test vector generator 4, the processor 12 and the test response analysis unit 5 are integrated in the test system 2. The test vectors are transferred from the programmable algorithmic test vector generator to the DUT 1 via the connection 10. Therein they traverse the logic component 8. The test response vectors are transferred, via the connection 11, to the test response analysis unit 5 in the test system 2 in which the test response vectors are compressed so as to form a check sum. The check sum is compared with a reference checksum, stored in the test system, in order to produce a test result.

The processor 12 provides the generating of the test vectors in real time as well as the compression of the test response vectors transferred by the DUT 1.

A Multiple Input Shift Register (MISR) constitutes a hardware implementation of a test response analysis unit. It compresses all outputs into a signature or check sum. This method is also referred to as a Cyclic Redundancy Check (CRC). A further implementation of a test response analysis unit is formed by an adder which forms each time a check sum. The test response analysis unit can also be realized by means of a processor.

There are several possibilities for generating the result of such a test or the fault indication. The reference check sum, calculated in advance, may be stored in the DUT 1, in which case it is also compared in this DUT 1, and a pass or reject decision is output as a fault decision. It is also possible to store this reference check sum in the test system wherein the comparison is then also performed.

The invention claimed is:

1. A circuit arrangement comprising:
   a tester that includes a programmable test vector generator for generating test vectors; and
   an integrated circuit that includes
      logic circuitry to be tested using the test vectors,
      a test control block to control testing of the logic circuitry, and
      a test response and analysis unit configured and arranged to receive test results from the logic circuitry in response to the test vectors, to produce a compact representation of said test results, and to output said compact representation to the tester.

2. The arrangement of claim 1, wherein the programmable test vector generator is a programmable algorithmic test vector generator which includes an arithmetic logic unit and the programmable test vector generator is programmed to generate test vectors in real time.

3. The arrangement of claim 1, wherein the programmable test vector generator is programmed to generate pseudo-random test vectors and deterministic test vectors for the logic circuitry.

4. The arrangement of claim 1, wherein the programmable test vector generator is programmed to generate test vectors for the logic circuitry in real time.

5. An integrated circuit comprising:
   logic circuitry to be tested using test vectors generated by an external tester;
   a test control block to control testing of the logic circuitry; and
   a test response and analysis unit to receive test results from the logic circuitry in response to the test vectors, to produce a compact representation of said test results, and to output said compact representation to the external tester.

6. The intergrated circuit of claim 5 wherein the test response analysis unit comprises a multiple input shift register to compress the test response vectors into a checksum that can be checked against a reference.

7. A method of testing logic circuitry of an integrated circuit, the integrated circuit including a test response analysis unit, the method comprising:
   generating within an external tester test vectors for testing the logic circuitry, using a programmable test vector generator;
   the integrated circuit receiving the test vectors and applying the test vectors to the logic circuitry;
   the test response analysis unit receiving from the logic circuitry test results in response to the test vectors and producing a compact representation of said test results; and
   outputting said compact representation to the external tester.

8. The method of claim 7 wherein said compact presentation includes test vectors applied directly to the external tester to enable fault localization on the logic circuitry.

9. The method of claim 7, further comprising programming the programmable test vector generator to modify the test vectors based on the logic circuitry to be tested.

10. The method of claim 7, further comprising programming the programmable test vector generator to generate test vectors for the logic circuitry in real time.

11. The method of claim 7, further comprising programming the programmable test vector generator to generate test pseudo-random test vectors and deterministic test vectors for the logic circuitry.

* * * * *